United States Patent
Son et al.

(10) Patent No.: US 12,419,177 B2
(45) Date of Patent: Sep. 16, 2025

(54) OPTICAL PATH CONTROL MEMBER AND DISPLAY DEVICE COMPRISING SAME

(71) Applicant: LG INNOTEK CO., LTD., Seoul (KR)

(72) Inventors: Mun Yeong Son, Seoul (KR); Hyeon Ji Hong, Seoul (KR); Jin Mi Noh, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 388 days.

(21) Appl. No.: 18/041,044

(22) PCT Filed: Aug. 17, 2021

(86) PCT No.: PCT/KR2021/010886
§ 371 (c)(1),
(2) Date: Feb. 8, 2023

(87) PCT Pub. No.: WO2022/045661
PCT Pub. Date: Mar. 3, 2022

(65) Prior Publication Data
US 2023/0324759 A1    Oct. 12, 2023

(30) Foreign Application Priority Data

Aug. 25, 2020  (KR) .................. 10-2020-0106997
Aug. 27, 2020  (KR) .................. 10-2020-0108362

(51) Int. Cl.
*G02F 1/16757*    (2019.01)
*G02F 1/13*       (2006.01)
(Continued)

(52) U.S. Cl.
CPC ........... *H10K 59/38* (2023.02); *G02F 1/1323* (2013.01); *G02F 1/167* (2013.01); *H10K 59/50* (2023.02);
(Continued)

(58) Field of Classification Search
CPC ..................... G02F 1/16757; G02F 1/1681
See application file for complete search history.

(56) References Cited

U.S. PATENT DOCUMENTS 8,094,364 B2     1/2012  Park
12,092,937 B2 *  9/2024  Kim ............... G02B 26/023
(Continued)

FOREIGN PATENT DOCUMENTS

JP    2013-37337 A    2/2013
JP    2017-125197 A   7/2017
(Continued)

OTHER PUBLICATIONS

International Search Report dated Dec. 7, 2021 in International Application No. PCT/KR2021/010886.
(Continued)

*Primary Examiner* — Joseph P Martinez
(74) *Attorney, Agent, or Firm* — Saliwanchik, Lloyd & Eisenschenk

(57) ABSTRACT

An optical path control member, according to one embodiment, comprises: a first substrate; a first electrode disposed on the first substrate; a second substrate disposed on the first substrate; a second electrode disposed under the second substrate; and a light conversion unit disposed between the first electrode and the second electrode, wherein the light conversion unit comprises a resin composition, the resin composition comprising an oligomer, a monomer, a photoinitiator and an additive, wherein the molecular weight of the monomer is at most 600 g/mol.

17 Claims, 13 Drawing Sheets

(51) Int. Cl.
  *G02F 1/167* (2019.01)
  *H10K 59/38* (2023.01)
  *H10K 59/50* (2023.01)
  *H10K 59/80* (2023.01)

(52) U.S. Cl.
  CPC ...... *G02F 2201/44* (2013.01); *H10K 59/8791* (2023.02)

(56) References Cited

U.S. PATENT DOCUMENTS

| | | |
|---|---|---|
| 2009/0135468 A1 | 5/2009 | Park |
| 2014/0058038 A1 | 2/2014 | Hunt et al. |
| 2020/0326604 A1 | 10/2020 | Yoon et al. |
| 2021/0373403 A1 | 12/2021 | Kim et al. |

FOREIGN PATENT DOCUMENTS

| | | |
|---|---|---|
| KR | 10-2009-0054278 A | 5/2009 |
| KR | 10-2012-0028264 A | 3/2012 |
| KR | 10-2016-0027890 A | 3/2016 |
| KR | 10-2016-0059920 A | 5/2016 |
| KR | 10-2019-0050722 A | 5/2019 |
| KR | 10-2019-0064040 A | 6/2019 |
| KR | 10-2019-0097670 A | 8/2019 |
| KR | 10-2020-0028078 A | 3/2020 |
| KR | 10-2020-0077342 A | 6/2020 |

OTHER PUBLICATIONS

Office Action dated Jan. 7, 2025 in Korean Application No. 10-2020-0108362.

\* cited by examiner

LIGHT BLOCKING MODE

OPTICAL PATH CONTROL MEMBER AND DISPLAY DEVICE COMPRISING SAME

CROSS-REFERENCE TO RELATED APPLICATIONS

This application is the U.S. national stage application of International Patent Application No. PCT/KR2021/010886, filed Aug. 17, 2021, which claims the benefit under 35 U.S.C. § 119 of Korean Application No. 10-2020-0106997, filed Aug. 25, 2020; and 10-2020-0108362, filed Aug. 27, 2020; the disclosures of each of which are incorporated herein by reference in their entirety.

TECHNICAL FIELD

An embodiment relates to an optical path control member, and to a display device including the same.

BACKGROUND ART

A light blocking film blocks transmitting of light from a light source, and is attached to a front surface of a display panel which is a display device used for a mobile phone, a notebook, a tablet PC, a vehicle navigation device, a vehicle touch, etc., so that the light blocking film adjusts a viewing angle of light according to an incident angle of light to express a clear image quality at a viewing angle needed by a user when the display transmits a screen.

In addition, the light blocking film may be used for the window of a vehicle, building or the like to shield outside light partially to inhibit glare, or to inhibit the inside from being visible from the outside.

That is, the light blocking film may be an optical path control member that controls the movement path of light to block light in a specific direction and transmit light in a specific direction. Accordingly, it is possible to control the viewing angle of the user by controlling a transmission angle of the light by the light blocking film.

Meanwhile, such a light blocking film may be divided into a light blocking film that can always control the viewing angle regardless of the surrounding environment or the user's environment and a switchable light blocking film that allow the user to turn on/off the viewing angle control according to the surrounding environment or the user's environment.

Such a switchable light blocking film may be implemented by converting a pattern part into a light transmitting part and a light blocking part by filling the inside of the accommodating part with light conversion material including particles that may move when a voltage is applied and a dispersion liquid for dispersing the particles and by dispersing and aggregating the particles.

Meanwhile, the light conversion unit is formed by imprinting a photocurable resin, and thus, a base part, a barrier rib part, and an accommodating part may be formed in the light conversion unit. At this time, when the barrier rib part and the accommodating part are formed, the shape and height of the barrier rib part may become non-uniform due to mold release defects, and thus, the width and height of the accommodating part between the barrier rib parts may also become non-uniform.

In addition, when the height of the base part increases, resistance between the accommodating part and the electrode increases, and thus, driving characteristics of the switchable light blocking film may be reduced.

Accordingly, the optical path control member having a new structure capable of solving the above problems is required.

DISCLOSURE

Technical Problem

An embodiment relates to an optical path control member having improved driving characteristics.

Technical Solution

An optical path control member according to an embodiment includes: a first substrate; a first electrode disposed on the first substrate; a second substrate disposed on the first substrate; a second electrode disposed under the second substrate; and a light conversion unit disposed between the first electrode and the second electrode, wherein the light conversion unit includes a resin composition, wherein the resin composition includes an oligomer, a monomer, a photoinitiator and an additive, wherein a molecular weight of the monomer is 600 g/mol or less.

Advantageous Effects

An optical path control member according to the embodiment may control the molecular weight and viscosity of the resin composition of the light conversion unit.

Accordingly, the thickness of the base part of the light conversion unit may be reduced, and the shape of the base part may be uniformly formed.

In detail, since the resin composition includes at least one monomer having a molecular weight of 600 g/mol or less, the crosslinking structure of the resin composition may be made dense, thereby the crosslinking density of the resin composition may be improved. Accordingly, filling characteristics of the resin composition may be improved, and the thickness of the base of the light conversion unit may be reduced.

Therefore, since the thickness of the base part is reduced and the distance between the electrode and the accommodating part is reduced, charge movement can be facilitated, and thus the driving characteristics of the optical path control member may be improved.

In addition, the resin composition may have a viscosity of 400 cPs or less.

Accordingly, since release characteristics of the resin composition and the mold member may be improved, variations in width and thickness of the base part of the optical path control member may be minimized.

Therefore, since the shape of the barrier rib part is uniform, the shape of the accommodating part between the barrier rib parts is also uniform, so that capillary characteristics may be improved when the light conversion material is injected into the accommodating part.

In addition, the optical path control member according to the embodiment may improve the driving speed and driving characteristics of the optical path control member by improving the moving speed of the light conversion particles.

That is, since the resin composition forming the barrier rib part and/or the base part includes a monomer having a coupling group having a high electronegativity, the barrier rib part and/or the base part may include a plurality of negative charges, and thus, polarity of the barrier rib part and/or the base part may increase.

Accordingly, it is possible to facilitate the movement of the light conversion particles by moving dispersants having positive charges in the light conversion material in the direction of the barrier rib and/or the base. In addition, since the positively charged dispersant is bonded with the light conversion particles, the negative charge of the light conversion particles is inhibited from decreasing, and thus, the movement speed of the light conversion particles may be improved.

Accordingly, the optical path control member according to the embodiment may have improved driving speed and driving characteristics.

MODES OF THE INVENTION

Hereinafter, embodiments of the present invention will be described in detail with reference to the accompanying drawings. However, the spirit and scope of the present invention is not limited to a part of the embodiments described, and may be implemented in various other forms, and within the spirit and scope of the present invention, one or more of the elements of the embodiments may be selectively combined and replaced.

In addition, unless expressly otherwise defined and described, the terms used in the embodiments of the present invention (including technical and scientific terms) may be construed the same meaning as commonly understood by one of ordinary skill in the art to which this invention belongs, and the terms such as those defined in commonly used dictionaries may be interpreted as having a meaning that is consistent with their meaning in the context of the relevant art.

In addition, the terms used in the embodiments of the present invention are for describing the embodiments and are not intended to limit the present invention. In this specification, the singular forms may also include the plural forms unless specifically stated in the phrase, and may include at least one of all combinations that may be combined in A, B, and C when described in "at least one (or more) of A (and), B, and C".

Further, in describing the elements of the embodiments of the present invention, the terms such as first, second, A, B, (a), and (b) may be used. These terms are only used to distinguish the elements from other elements, and the terms are not limited to the essence, order, or order of the elements.

In addition, when an element is described as being "connected", or "coupled" to another element, it may include not only when the element is directly "connected" to, or "coupled" to other elements, but also when the element is "connected", or "coupled" by another element between the element and other elements.

Further, when described as being formed or disposed "on (over)" or "under (below)" of each element, the "on (over)" or "under (below)" may include not only when two elements are directly connected to each other, but also when one or more other elements are formed or disposed between two elements.

Furthermore, when expressed as "on (over)" or "under (below)", it may include not only the upper direction but also the lower direction based on one element.

Hereinafter, an optical path control member according to an embodiment will be described with reference to drawings.

First, the light conversion unit of the optical path control member according to the embodiment will be described with reference to FIGS. 1 to 4.

Figure 1:
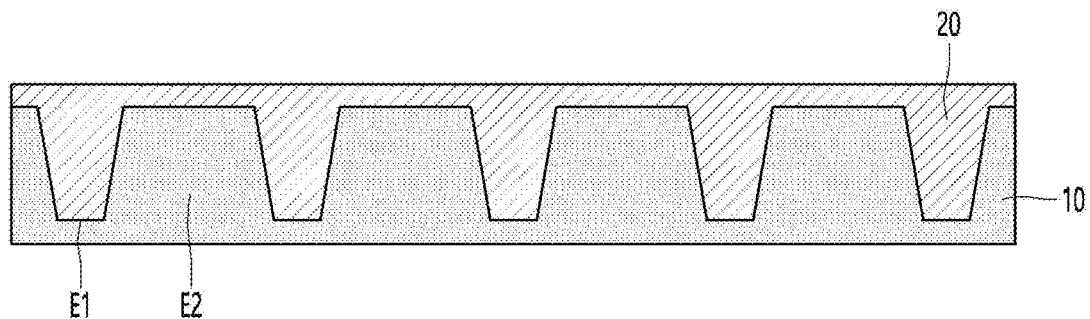
FIGS. 1 to 3 are views for explaining a manufacturing process of a light conversion unit of an optical path control member according to an embodiment.
Figure 2:
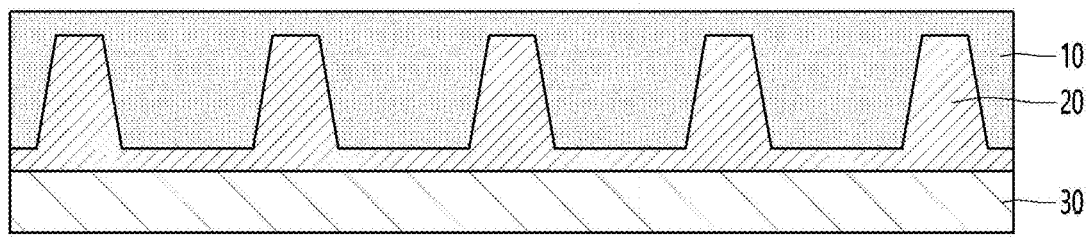
Figure 3:
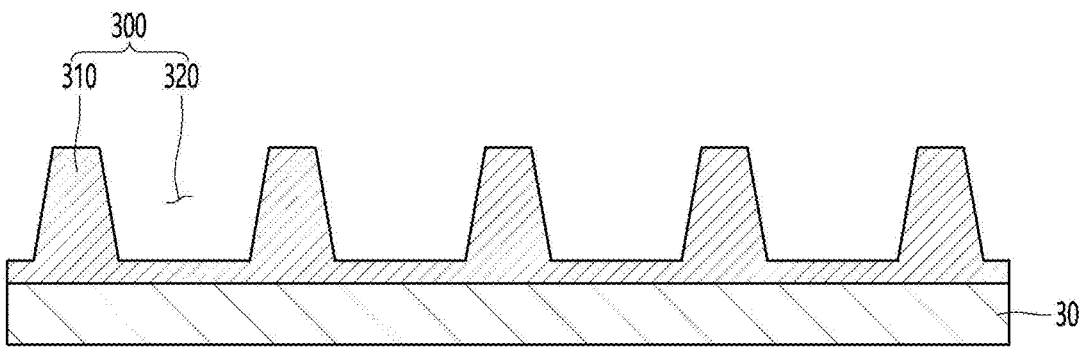

FIGS. 1 to 3 are views for explaining a manufacturing process of a light conversion unit of an optical path control member according to an embodiment.

Referring to FIG. 1, after preparing a mold member 10 including an intaglio portion E1 and an embossed portion E2, a resin composition 20 may be filled in the intaglio portion E1 of the mold member 10. The resin composition 20 may include a urethane-based resin composition.

Since the resin composition 20 is filled in the intaglio portion E1 of the mold member 10, the resin composition 20 may be disposed on the upper portion of the intaglio portion E1 and the embossed portion E2 while filling the intaglio portion E1.

Subsequently, referring to FIG. 2, the mold member 10 filled with the resin composition 20 and the substrate 30 on which the light conversion unit is disposed may be bonded. That is, the mold member 10 and the substrate 30 may be adhered to each other by the resin composition 20 disposed on the mold member 10.

Subsequently, referring to FIG. 3, the mold member 10 is released, and thus, the light conversion unit 300 including the resin composition and including the barrier rib part 310 and the accommodating part 320 may be formed on the substrate 30.

That is, the light conversion unit 300 is formed on the substrate 30 by releasing the mold member 10, and the light conversion unit 300 may include the barrier rib part 310, the accommodating part 320 and a base part 350.

In this case, when the releasability of the mold member 10 and the resin composition 20 are reduced, the shape and size of the barrier rib part 310 and the accommodating part 320 may become non-uniform while the mold member 10 and the resin composition 20 are released. Accordingly, the luminance uniformity of the optical path control member may be reduced, and when the light conversion material is injected into the accommodating part 320, the injection failure may be occurred by filling speed of each accommodating part may be different.

In addition, when the thickness of the base part 350 is increased, the distance between the accommodating part and the electrode increases, thereby increasing resistance, and thereby reducing the driving speed of the light conversion particles inside the accommodating part, accordingly the driving characteristics of the optical path control member may be reduced.

Accordingly, the optical path control member according to the embodiment solves the above problem by controlling the properties of the material forming the light conversion unit.

The light conversion unit according to the embodiment may include the resin composition. The resin composition may include an oligomer, a monomer, and a photoinitiator. Alternatively, the resin composition may include the oligomer, the monomer, the photoinitiator, and an additive. The resin composition may constitute the light conversion unit by a reaction between a prepolymer in the form of a polymer, a multifunctional monomer as a diluent, and a photoinitiator.

Figure 4:
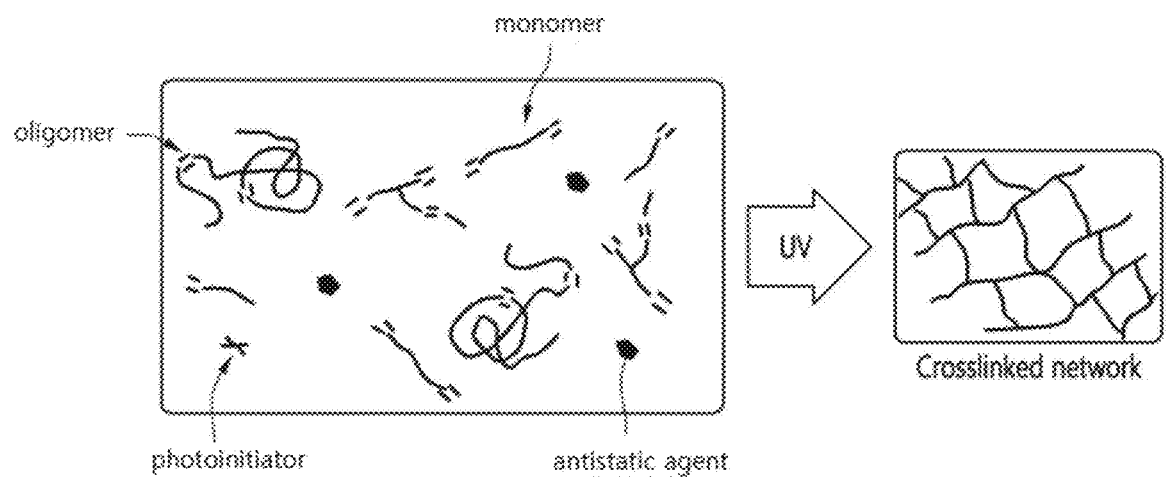
FIG. 4 is a view for explaining a curing process of a resin composition of the light conversion unit according to the embodiment.

That is, referring to FIG. 4, the resin composition includes the oligomer, the monomer, the photoinitiator, and the additive before curing, and the resin composition may be cured by ultraviolet light while forming a network of crosslinking structure by the reaction of the polymer, the monomer, and the photoinitiator.

The resin composition may include a urethane acrylate polymer. For example, the oligomer may include urethane acrylate.

In addition, as the photoinitiator, a known photoinitiator for UV curing may be applied. In addition, the additive may include a material for improving releasability or electrical properties of the resin composition. For example, the additives may include various materials including release additives and antistatic agents.

In addition, the monomer may include a low molecular weight monomer. In detail, the monomer may have a molecular weight of 600 g/mol or less. In more detail, the monomer may have a molecular weight of 100 g/mol to 600 g/mol. In more detail, the monomer may have a molecular weight of 200 g/mol to 500 g/mol. In more detail, the monomer may have a molecular weight of 300 g/mol to 400 g/mol.

The molecular weight of the monomer may be related to the crosslinking density after curing of the resin composition. As the molecular weight of the monomer is reduced, the chain length of the polymer is shortened and contraction occurs, thereby improving the crosslinking density.

Accordingly, when the resin composition is filled in the intaglio portion of the mold member, filling characteristics may be improved, and the thickness of the base part disposed above the mold member may be reduced.

When the molecular weight of the monomer exceeds 600 g/mol, the crosslinking density of the resin composition is reduced, whereby, when the resin composition is filled in the mold member, the thickness of the base part disposed on the mold member may be increased.

The monomer may include various monomers having a molecular weight of 600 g/mol or less. For example, the monomer may include at least one of HEA, BMA, 2-PEA, CTFA, IBOA, EOEOEA, IDA, TPGDA, TCDDMDA, BPA3EODA, and BPA4EODA. For example, the monomer may include at least two of the monomers having a molecular weight of 600 g/mol or less.

Since the resin composition includes the monomer having a molecular weight of 600 g/mol or less, the thickness of the base part of the light conversion unit formed by the resin composition may be reduced.

Meanwhile, the resin composition may have low viscosity. Low viscosity of the resin composition may be implemented by the monomer having a low molecular weight.

The resin composition may have a viscosity of 400 cPs or less. In detail, the resin composition may have a viscosity of 200 cPs to 400 cPs. In more detail, the resin composition may have a viscosity of 250 cPs to 350 cPs. In more detail, the resin composition may have a viscosity of 280 cPs to 330 cPs.

When the viscosity of the resin composition exceeds 400 cPs, releasability between the resin composition and the mold member may decrease. Accordingly, when the mold member and the resin composition are released, the barrier rib part of the light conversion unit may be damaged, and thus, defect may be occurred.

In addition, when the mold member and the resin composition are released, a difference in height and width of the barrier rib parts may be occurred, and thus, a difference in height and width of the accommodating parts disposed between the barrier rib parts may be occurred.

Therefore, when the light conversion material is injected into the accommodating part in a capillary manner, a difference in the capillary effect occurs due to a difference in cross-sectional area due to a change in the cross-sectional area of the accommodating parts, and thus, insufficient filling of the light conversion material may be occurred by a difference in filling speed of each accommodating part.

Meanwhile, the monomer may include a plurality of monomers. In detail, the monomer may include a first monomer and a second monomer having different molecular weights. For example, the first monomer may have a molecular weight of 600 g/mol or less, and the second monomer may have a molecular weight of greater than 600 g/mol.

The first monomer and the second monomer may be included in different ratios with respect to the entirety of the monomers. in detail, the second monomer having a relatively high molecular weight may be included more than the first monomer having a relatively small molecular weight.

For example, the ratio of the first monomer to the second monomer may be 1:3 to 2:3. Accordingly, the crosslinking density of the resin composition may be improved by the first monomer and the strength of the resin composition may be improved by the second monomer, and thus, improving characteristics of the barrier rib part and the base part formed by the resin composition.

The oligomer, the monomers, the photoinitiator, and the additive included in the resin composition may be included in different weight %.

In detail, the oligomer may be included in an amount of 40% to 60% by weight based on the total weight of the resin composition.

In addition, the monomer may be included in an amount of 30% to 40% by weight based on the total weight of the resin composition.

In addition, the photoinitiator may be included in an amount of 0.1% to 5% by weight based on the total weight of the resin composition.

In addition, the additive may be included in an amount of 0.1% to 5% by weight based on the total weight of the resin composition.

Hereinafter, the optical path control member including the above-described light conversion unit will be described in detail with reference to FIGS. 5 and 6.

Figure 5:
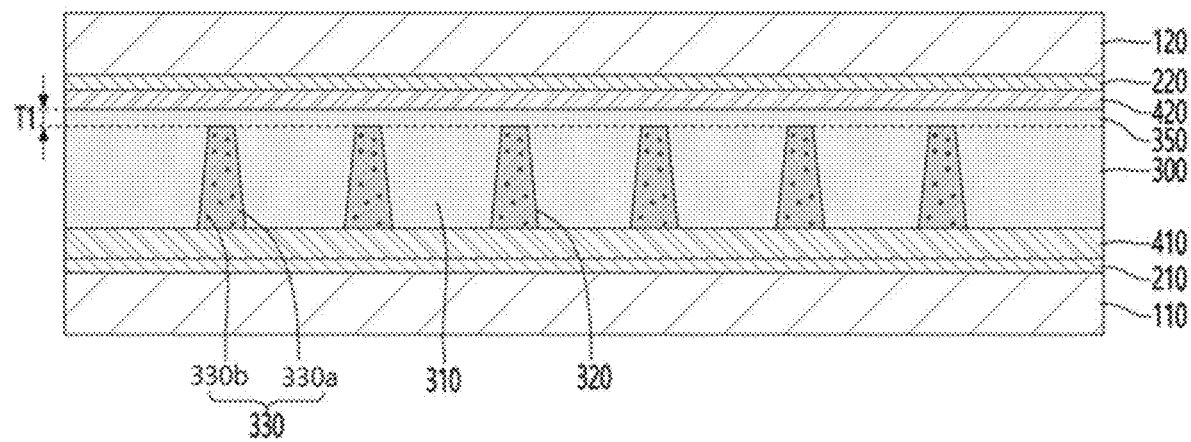
FIGS. 5 and 6 are cross-sectional views of the optical path control member according to the embodiment.
Figure 6:
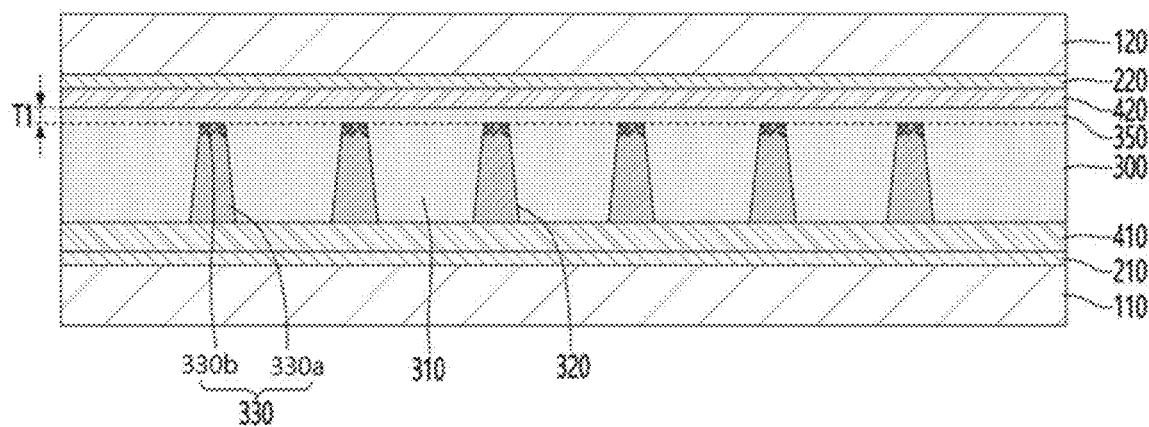

Referring to FIGS. 5 and 6, the light conversion unit 300 may include a barrier rib part 310 and an accommodating part 320. The light conversion unit 300 may be formed using the resin composition described above.

The barrier rib part 310 may be defined as a barrier rib region dividing the accommodating part. That is, the barrier rib part 310 is a barrier rib region dividing a plurality of accommodating parts and may transmit light. That is, light emitted in the direction of the first substrate 110 or the second substrate 120 may pass through the barrier rib part.

The accommodating part 320 may be formed to partially penetrate the light conversion unit 300. Accordingly, the accommodating part 320 may contact adhesive layer 410 and be spaced apart from buffer layer 420. Accordingly, the base part 350 may be formed between the accommodating part 320 and the buffer layer 420.

The base part 350 may be disposed on the barrier rib part 310. In detail, the base part 350 may be disposed in contact with a second electrode 220, and the barrier rib part 310 may be disposed below the base part 350.

A thickness T1 of the base part 350 and a thickness T2 of the barrier rib part 310 may be different from each other. In detail, the thickness T1 of the base part 350 may be smaller than the thickness T2 of the barrier rib part 310.

For example, the thickness T1 of the base part 350 may be 10 μm or less. In detail, the thickness T1 of the base part 350 may be 1 μm to 10 μm. In more detail, the thickness T1 of the base part 350 may be 3 μm to 8 μm. In more detail, the thickness T1 of the base part 350 may be 5 μm to 7 μm.

When the thickness T1 of the base prat 350 exceeds 10 μm, a distance between the second electrode 220 and the accommodating part 320 may increase. That is, the distance between the accommodating part 320 including the light conversion material and the second electrode 220 may increase. Accordingly, the movement characteristics of charges moving through the second electrode 220 to the accommodating part 320 including the light conversion material are reduced by the base part 350 having high resistance, and thus, the driving characteristic of the optical path control member may be reduced.

In addition, since it is difficult to implement in an imprinting process that the thickness T1 of the base part 350 is less than 1 μm, process efficiency may decrease.

The barrier rib part 310 and the accommodating part 320 may be disposed while extending in the second direction of a first substrate 110 and a second substrate 120. That is, the barrier rib part 310 and the accommodating part 320 may extend in the width direction or the length direction of the first substrate 110 and the second substrate 120.

The barrier rib part 310 and the accommodating part 320 may be disposed in different widths. For example, the width of the barrier rib part 310 may be greater than that of the accommodating part 320.

In addition, the accommodating part 320 may be formed in a shape in which a width narrows while extending from a first electrode 210 toward the second electrode 220.

The barrier rib part 310 and the accommodating part 320 may be alternately disposed. In detail, the barrier rib part 310 and the accommodating part 320 may be alternately disposed. That is, each of the barrier rib part 310 may be disposed between the accommodating part s 320 adjacent to each other, and each accommodating part 320 may be disposed between the barrier rib part s 310 adjacent to each other.

Also, the plurality of barrier rib parts 310 may be formed to have a uniform thickness. In detail, the thickness deviation of the plurality of barrier rib parts 310 may be 10% or less. In more detail, the thickness variation of the plurality of barrier rib parts 310 may be 5% to 10%. In more detail, the thickness deviation of the plurality of barrier rib parts 310 may be 7% to 9%.

Since the optical path control member according to the embodiment forms the barrier rib part using the resin composition described above, it is possible to minimize a thickness variation of the plurality of barrier rib parts.

When the thickness deviation of the plurality of barrier rib parts 310 exceeds 10%, a difference in cross-sectional area of the accommodating parts between the barrier rib parts occurs, and when the light conversion material is filled in the accommodating part, filling characteristics of the light converting material of the plurality of accommodating parts may be different due to the difference in cross-sectional area, and thus, deviation of the light conversion material may occur, thereby the optical characteristics of the optical path control member may be reduce.

Also, the plurality of barrier rib parts 310 may be formed to have a uniform width. In detail, a width deviation of the plurality of barrier rib parts 310 may be 10% or less. In detail, the width deviation of the plurality of barrier rib parts 310 may be 3% to 10%. In more detail, the width deviation of the plurality of barrier rib parts 310 may be 5% to 8%.

Since the optical path control member according to the embodiment forms the barrier rib part using the resin composition described above, it is possible to minimize the width deviation of the plurality of barrier rib parts.

When the width deviation of the plurality of barrier rib parts 310 exceeds 10%, a difference in cross-sectional area of the accommodating parts between the barrier rib parts occurs, and when the light conversion material is filled in the accommodating part, filling characteristics of the light converting material of the plurality of accommodating parts may be different due to the difference in cross-sectional area, and thus, deviation of the light conversion material may occur, thereby the optical characteristics of the optical path control member may be reduce.

The barrier rib part 310 may include a transparent material. The barrier rib part 310 may include a material capable of transmitting light. That is, the barrier rib part 310 may include the above-described transparent resin composition. For example, the barrier rib part 310 may include a transparent urethane acrylate polymer.

The light conversion material 330 including light conversion particles 330a and a dispersion liquid 330a in which the light conversion particles 330b are dispersed may be disposed in the accommodating part 320.

The dispersion liquid 330a may be a material that disperses the light conversion particles 330b. The dispersion liquid 330a may include a transparent material. The dispersion liquid 330a may include a non-polar solvent. In addition, the dispersion liquid 330a may include a material capable of transmitting light.

The light conversion particles 330b may be dispersed in the dispersion liquid 330a. In detail, the plurality of light conversion particles 330b may be spaced apart from each other in the dispersion liquid 330a.

The light conversion particles 330b may include a material capable of absorbing light. That is, the light conversion particles 330b may be light absorbing particles. The light conversion particles 330b may have a color. For example, the light conversion particles 330b may have a black-based color. For example, the light conversion particles 330*b* may include carbon black particles.

A surface of the light conversion particle 330*b* may be charged and may have a polarity. For example, the surface of the light conversion particle 330*b* may be negatively charged. Accordingly, the light conversion particles 330*b* may be moved toward the first electrode 210 or the second electrode 220 by applying the voltage.

The light transmittance of the accommodating part 320 may be changed by the light conversion particles 330*b*. In detail, the accommodating part 320 may be changed into a light blocking part and a light transmitting part by changing light transmittance by the light conversion particles 330*b*. That is, the accommodating part 320 may change the transmittance of light passing through the accommodating part 320 by dispersion and aggregation of the light conversion particles 330*b* disposed in the dispersion liquid 330*a*.

For example, the mode of the optical path member according to the first embodiment may be changed from the first mode to the second mode or from the second mode to the first mode by the voltage applied to the first electrode 210 and the second electrode 220.

In detail, in the optical path control member according to the embodiment, the accommodating part 320 becomes a light blocking part in the first mode, and light of a specific angle may be blocked by the accommodating part 320. That is, the viewing angle of the user looking from the outside is narrowed, so that the optical path control member may be driven in the privacy mode.

Also, in the optical path control member according to the embodiment, the accommodating part 320 becomes a light transmitting part in the second mode, and light may pass through both the barrier rib part 310 and the accommodating part 320. That is, the viewing angle of the user looking from the outside is widened, so that the optical path control member may be driven in the open mode.

The conversion from the first mode to the second mode, that is, the conversion of the accommodating part 320 from a light blocking part to a light transmitting part may be realized by the movement of the light conversion particles 330*b* in the accommodating part 320. That is, the surface of the light conversion particles 330*b* has electric charges, and when a voltage is applied, the light conversion particles 330*a* may move toward the first electrode or the second electrode according to the characteristics of the electric charge. That is, the light conversion particles 330*a* may be electrophoretic particles.

For example, when voltage is not applied to the optical path control member from the outside, the light conversion particles 330*b* of the accommodating part 320 are uniformly dispersed in the dispersion liquid 330*a*, and thus the accommodating part 320 may block light by the light conversion particles 330*b*. Accordingly, in the first mode, the accommodating part 320 may be driven as a light blocking part.

Also, when a voltage is applied to the optical path control member from the outside, the light conversion particles 330*b* may move. For example, the light conversion particles 330*b* may move toward one end or the other end of the accommodating part 320 by the voltage transmitted by the first electrode 210 and the second electrode 220. That is, the light conversion particles 330*a* may move toward the first electrode 210 or the second electrode 220.

For example, when a voltage is applied to the first electrode 210 and/or the second electrode 220, an electric field is formed between the first electrode 210 and the second electrode 220, and the negatively charged light conversion particles 330*b* may move in the direction of the positive electrode among the electrodes 210 and 220 using the dispersion liquid 330*a* as a medium.

For example, referring to FIG. 5, in an initial mode or when no voltage is applied to the first electrode 210 and/or the second electrode 220, the light conversion particles 330*b* may be uniformly dispersed in the dispersion liquid 330*a*, and the accommodating part 320 may be driven as a light blocking part.

In addition, referring to FIG. 6, when a voltage is applied to the first electrode 210 and/or the second electrode 220, the light conversion particles 330*b* may move in the direction of the second electrode 220 in the dispersion liquid 330*b*. That is, the light conversion particles 330*b* may be moved in one direction, and the accommodating part 320 may be driven as a light transmitting part.

Accordingly, the optical path control member according to the embodiment may be driven in two modes according to a user's surrounding environment. That is, when the user requires light transmission only at a specific viewing angle, the accommodation part is driven as the light blocking part, or in an environment in which the user requires high brightness, a voltage may be applied to drive the accommodation part as the light transmitting part.

Therefore, since the optical path control member according to the embodiment may be implemented in two modes according to the user's requirement, the optical path control member may be applied regardless of the user's environment.

Hereinafter, the present invention will be described in more detail with reference to the shapes of the barrier rib part and the base part according to the molecular weight and viscosity of the resin composition forming the light conversion unit of the optical path control member according to embodiment examples and comparative examples. These embodiment examples are only presented as examples in order to explain the present invention in more detail. Therefore, the present invention is not limited to these embodiment examples.

Embodiment Example 1

A resin composition was formed by mixing oligomer including a urethane acrylate, a monomer, a photoinitiator, and an antistatic agent.

At this time, the monomer having a molecular weight of 600 g/mol or less is used as the monomer. In detail, the monomer includes at least one of HEA, BMA, 2-PEA, CTFA, IBOA, EOEOEA, IDA, TPGDA, TCDDMDA, BPA3EODA and BPA4EODA.

Subsequently, after preparing a mold member including an intaglio portion and an embossed portion, the resin composition is filled in the intaglio portion of the mold member.

Subsequently, the mold member and the polyethylene terephthalate substrate are bonded. Subsequently, after the mold member and the resin composition were released, a base part, a barrier rib part with embossed shape, and an accommodating part with intaglio shape were formed on the substrate to form a light conversion unit.

Then, the thickness range of the base part was measured.

Comparative Example 1

A light conversion unit was formed in the same manner as in Embodiment Example 1, except that a monomer having a molecular weight of more than 600 g/mol was used. In detail, the monomer includes at least one of TMP9EOTA and BPA10EODMA having a molecular weight greater than 600 g/mol.

Then, the thickness range of the base part was measured.

TABLE 1

| | Embodiment Example 1 | Comparative Example 1 |
|---|---|---|
| Thickness of the base part (μm) | 1~10 | 15~30 |

Figure 7:
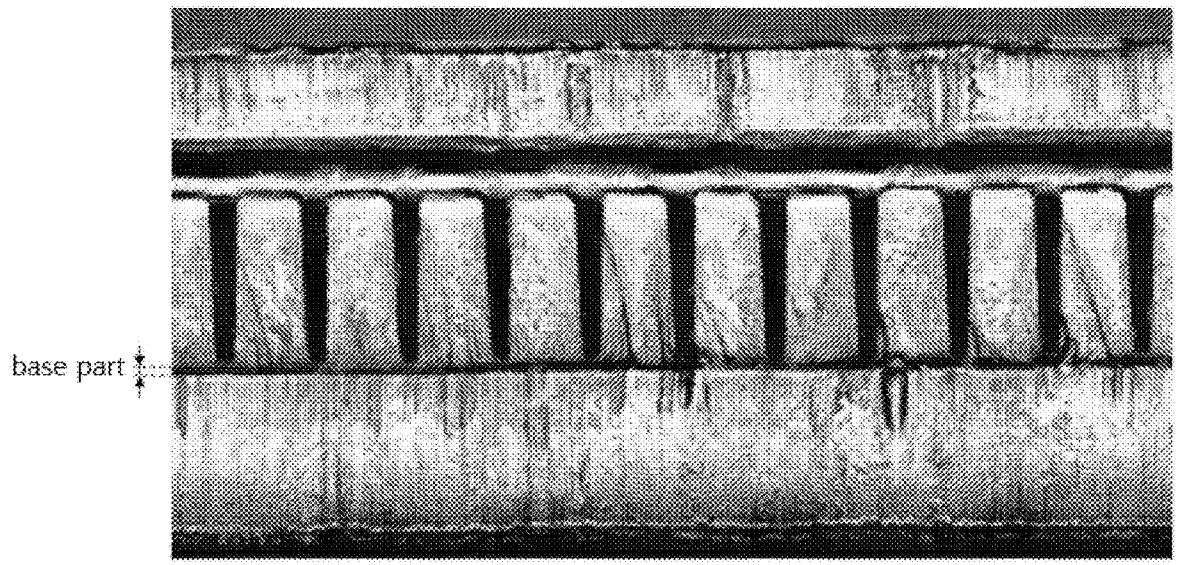
FIGS. 7 and 8 are views for explaining a base part of the light conversion unit according to the embodiment and a comparative example.
Figure 8:
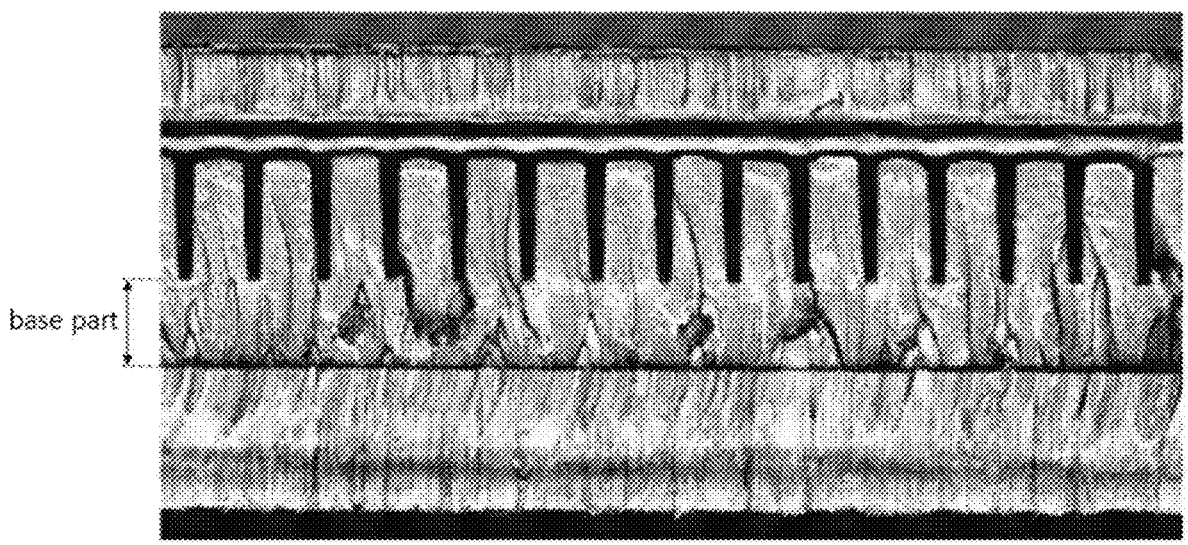

FIG. 7 is a view showing the light conversion unit according to the Embodiment Example 1, and FIG. 8 is a view showing the light conversion unit according to the Comparative Example 1.

Referring to Table 1 and FIGS. 7 and 8, it can be seen that the thickness of the base part of the light conversion unit according to Embodiment Example 1 is smaller than that of the base part according to Comparative Example 1.

That is, the base of the light conversion unit according to Embodiment Example 1 has a dense crosslinking structure due to the resin composition including a monomer having a low molecular weight, and thus it can be seen that the thickness of the base part is reduced by increasing the crosslinking density of the resin composition.

Embodiment Example 2

The light conversion unit was formed in the same manner as in Embodiment Example 1, except that it had a viscosity of 400 cPs or less.

Then, the shape of the base part was observed.

Comparative Example 2

The light conversion unit was formed in the same manner as in Comparative Example 1, except that it had a viscosity exceeding 400 cPs.

Then, the shape of the base part was observed.

Figure 9:
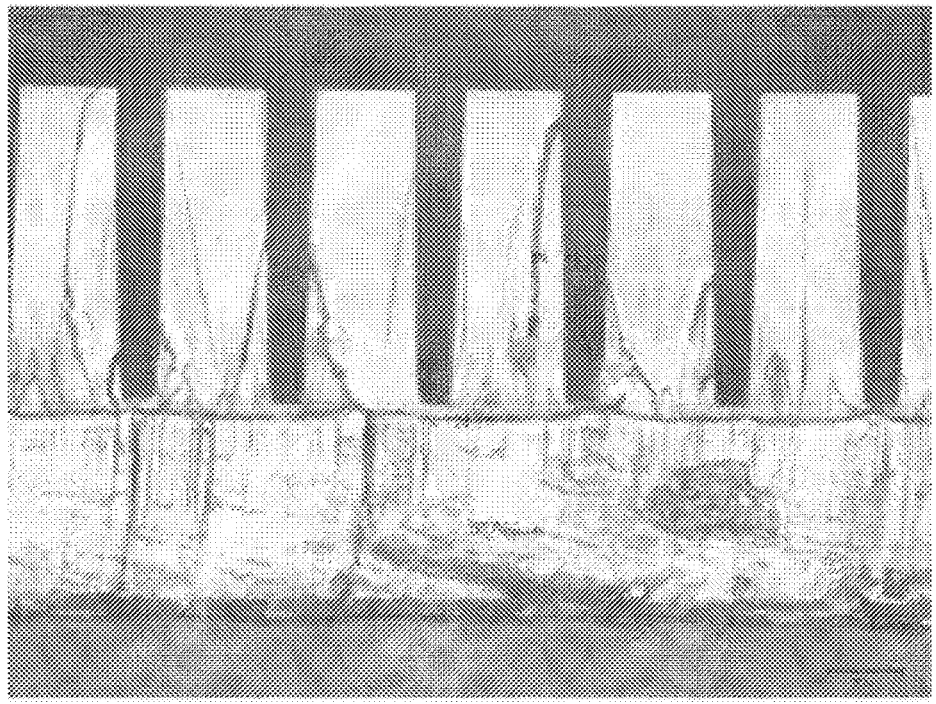
FIGS. 9 and 10 are views for explaining the shape of the light conversion unit according to the embodiment and the comparative example.
Figure 10:
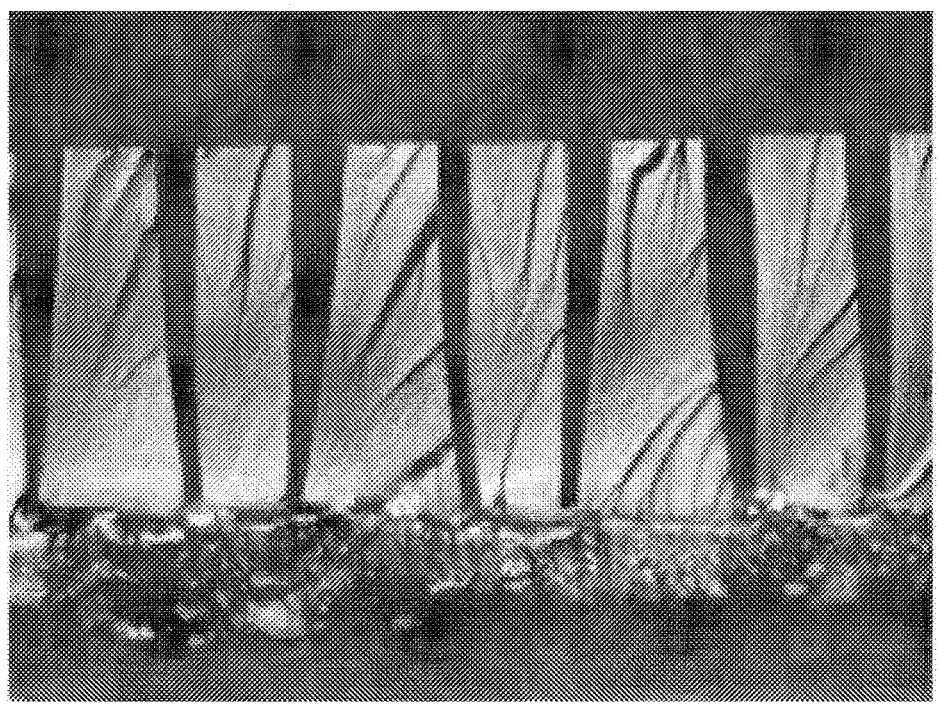

FIG. 9 is a view showing the light conversion unit according to the Embodiment Example 2, and FIG. 10 is a view showing the light conversion unit according to the Comparative Example 2.

Referring to FIGS. 9 and 10, it can be seen that the barrier rib part of the light conversion unit according to Embodiment Example 2 has a uniform shape. That is, it can be seen that the barrier rib part of the light conversion unit according to Embodiment Example 2 has a uniform width and height.

On the other hand, it can be seen that the shape of the barrier rib part of the light conversion unit according to Comparative Example 2 is non-uniform. That is, it can be seen that the barrier rib part of the light conversion unit according to Comparative Example 2 has a non-uniform width and height.

That is, it can be seen that the base of the light conversion unit according to Embodiment Example 2 has a uniform shape because the release characteristics of the mold member and the resin composition are improved by the low-viscosity resin composition.

Hereinafter, an optical path control member according to another embodiment will be described with reference to FIGS. 11 to 15.

Figure 11:
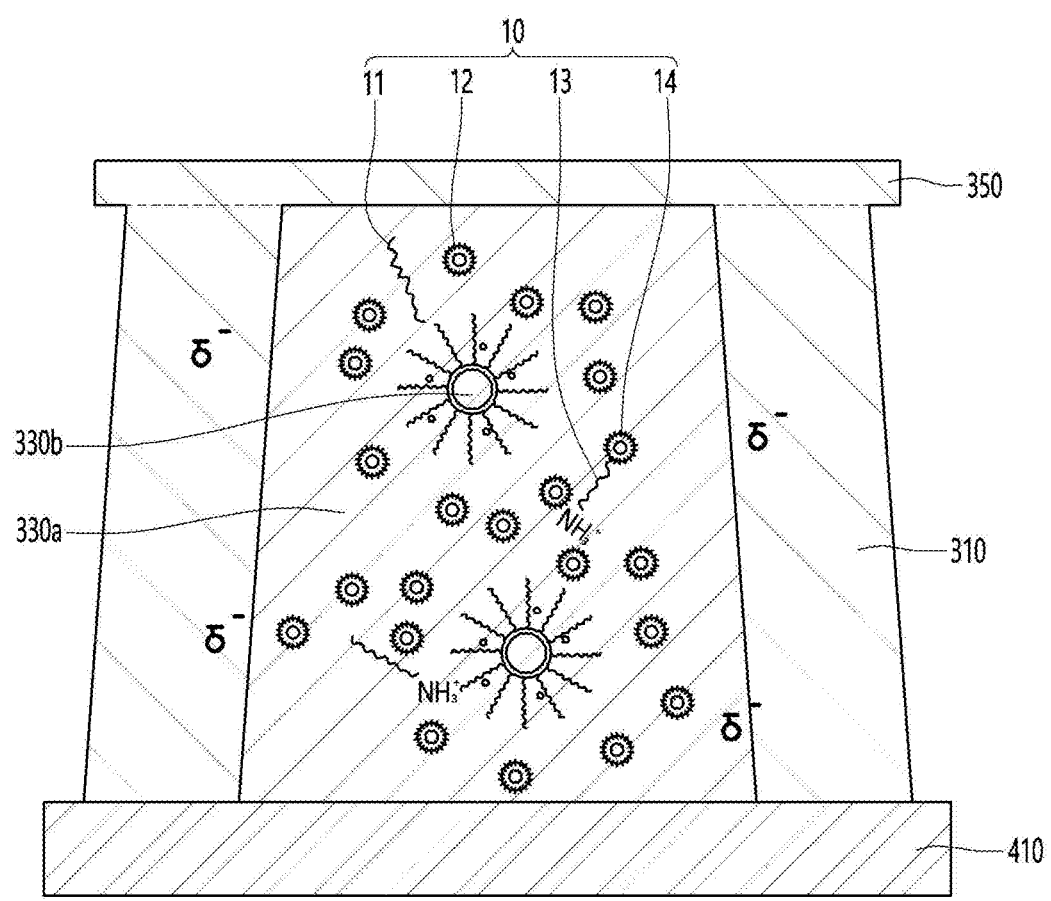
FIGS. 11 and 12 are enlarged views of one region of the light conversion unit of the optical path control member according to the embodiment.

FIG. 11 is a view showing an enlarged view of the inside of the conventional accommodating part 320.

Referring to FIG. 11, the light conversion material 330 may further include a plurality of dispersants 10. The dispersant 10 may be dispersed and disposed in the dispersion liquid 330a. The dispersant 10 may serve to inhibit the light conversion particles 330b from aggregating with each other. Accordingly, since the light conversion particles 330b are inhibited from aggregating in the dispersion liquid 330a, driving characteristics of the optical path control member may be improved.

The dispersant 10 may include different types of dispersants depending on whether or not they have polarity. In detail, the dispersing agent may include a first dispersing agent 11, a second dispersing agent 12, a third dispersing agent 13, and a fourth dispersing agent 14.

The first dispersant 11 may be defined as a non-polar dispersant. That is, the first dispersant 11 may be defined as a non-polar dispersant having no positive or negative charge.

The second dispersant 12 may be defined as a non-polar dispersant. In addition, the second dispersant may be defined as a dispersant having a particle shape. That is, the second dispersant may have a micelle shape formed by aggregation of the first dispersants 11.

The third dispersant 13 may be defined as a polar dispersant. In detail, the third dispersant 13 may be defined as a polar dispersant having a positive charge or a negative charge. For example, the third dispersant 13 may be defined as a dispersant having a polarity opposite to that of the light conversion particles.

For example, the third dispersant may be defined as a polar particle having a positive charge after the first dispersant 11 loses electrons by the light conversion particle 330a.

In addition, the fourth dispersant 14 may be defined as a polar dispersant. In detail, the fourth dispersant 14 may be defined as a polar dispersant having a positive charge or a negative charge. For example, the fourth dispersant 14 may be defined as a dispersant having a polarity opposite to that of the light conversion particles.

For example, the fourth dispersant may be defined as a dispersant with a particle shape formed by bonding the third dispersant in which the first dispersants 11 lose electrons by the light conversion particles 330a and are changed into positively charged polar particles with the second dispersant. That is, the fourth dispersant 14 may have a positively charged micelle shape formed by aggregation of the first dispersants 11.

The non-polar first dispersant 11 and the second dispersant 12 may be disposed between the light conversion particles 330b in the dispersion liquid 330a to inhibit aggregation of the light conversion particles 330b.

Also, the third dispersing dispersant 13 and the fourth dispersant 14 of polarity are disposed between the light conversion particles 330b like the first dispersant 11 and the second dispersant 12, and thus, aggregation of the light conversion particles 330b may be inhibited.

However, since the third dispersant 13 and the fourth dispersant 14 have charges different from those of the light conversion particles 330b, the polarity of the light conversion particles 330b inside the dispersion liquid 330a may be reduced. Accordingly, the polarity intensity of the light conversion particles 330a is reduced, and thus the moving speed of the light conversion particles 330b is reduced when voltage is applied, thereby reducing the driving speed of the optical path control member.

In addition, since the third dispersant 13 and the fourth dispersant 14 have polarities, they may move together with the light conversion particles 330b inside the dispersion liquid 330a when a voltage is applied, thereby hindering the movement of the light conversion particles 330b. Accordingly, the moving speed of the light conversion particles 330b may be reduced, and thus the driving speed of the optical path control member may be reduced.

Therefore, the light conversion unit of the optical path control member according to the embodiment may give polarity to the barrier rib part and/or the base part to solve problems caused by the dispersant having the polarity.

The optical path control member according to the embodiment may control characteristics of materials constituting the barrier rib part 310 and/or the base part 350 in order to impart a polarity to the barrier rib part 310 and/or the base part 350 of the light conversion unit.

In detail, the barrier rib part 310 and the base part 350 of the light conversion unit may include a resin composition.

The resin composition may include the oligomer, the monomer, the photoinitiator, and the additive. The resin composition may constitute the light conversion unit by a reaction between a prepolymer in the form of a polymer, a multifunctional monomer as a diluent, and a photoinitiator.

The resin composition includes the oligomer, the monomer, the photoinitiator, and the additive before curing, and the resin composition may be cured by ultraviolet light while forming a network of crosslinking structure by the reaction of the polymer, the monomer, and the photoinitiator.

The resin composition may include a urethane acrylate polymer. For example, the oligomer may include urethane acrylate.

In addition, as the photoinitiator, a known photoinitiator for UV curing may be applied. In addition, the additive may include a material for improving releasability or electrical properties of the resin composition. For example, the additives may include various materials including release additives and antistatic agents.

In addition, the monomer may include a plurality of boning groups. In detail, the monomer may include various boning groups to impart polarity to the resin composition.

In detail, the monomer may include a first boning group and a second boning group. The first boning group may have greater polarity than the second boning group. In detail, the electronegativity of the first boning group may be greater than that of the second boning group.

Figure 13:
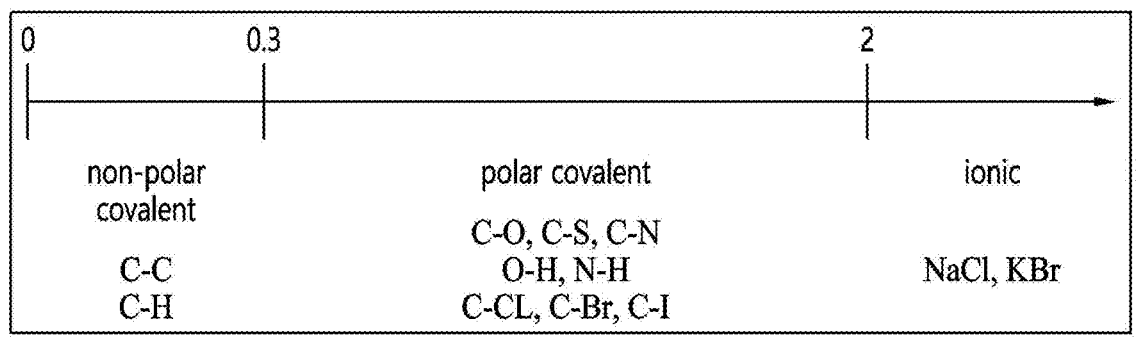
FIG. 13 is a view of polar strength according to bonding types.

FIG. 13 is a view showing polar strength according to the type of bonding group. The first bonding group may be defined as a bonding group having an electronegativity of 0.3 to 2. The second bonding group may be defined as a bonding group having an electronegativity of 0 to less than 0.3.

The monomer may include a first bonding group. For example, the monomer may include a monomer including at least one bonding group of C—O, C—S, C—N, O—H, N—H, C—Cl, C—Br, C—I, and Si—O—Si.

In addition, the monomer may further include a second bonding group. In detail, the monomer may further include at least one non-polar bonding group of C—C, C=O, and C—H.

The first bonding group may be more than the second bonding group. For example, the monomer may include monomers such as dipentaerythritol pentaacrylate and diphenyl (2,4,6-trimethylbenzoyl) phosphine oxide, but the embodiment is not limited thereto.

Accordingly, the resin composition including the monomer may have polarity. That is, the resin composition may have a negative charge. In detail, a contact angle θ between the resin composition including the monomer and water may be 60° or less. In more detail, a contact angle θ between the resin composition including the monomer and water may be 10° to 60°.

That is, since the resin composition includes a highly polar monomer, the resin composition including the monomer may also have polarity.

Accordingly, at least one of the barrier rib part 310 and the base part 350 of the light conversion unit formed of the resin composition may also have a polarity.

In detail, at least one of the barrier rib part 310 and the base part 350 may have a polarity opposite to that of the third dispersant 13 and the fourth dispersant 14. That is, at least one of the barrier rib part 310 and the base part 350 may have the same polarity as that of the light conversion particle 330b.

That is, the barrier rib part 310, the base part 350, and the light conversion particles 330b may include negative charges, and the third dispersant 13 and the fourth dispersant 14 may include positive charges.

Accordingly, dispersants having a polarity among the dispersants dispersed in the dispersion liquid 330a in the accommodating part 320 may move in a direction of at least one of the barrier rib part 310 and the base part 350.

Figure 12:
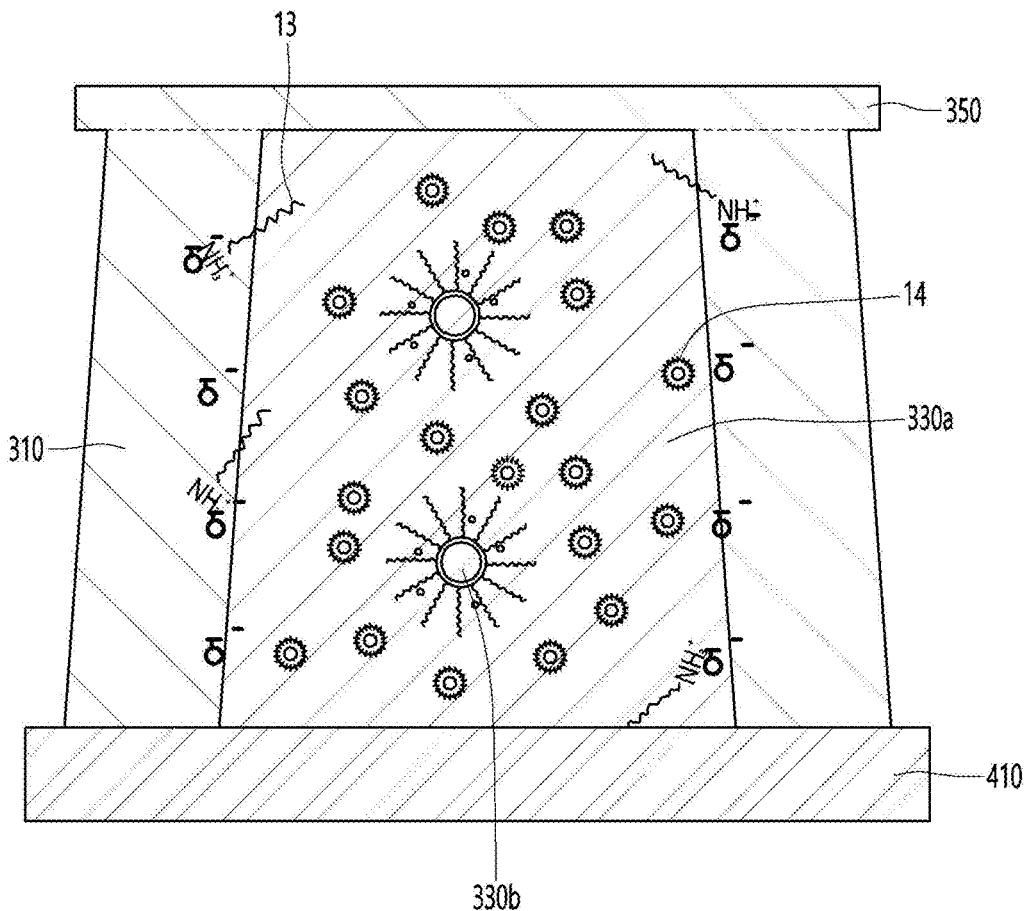

That is, referring to FIG. 12, the barrier rib part and the base part have electrophilicity properties and thus have a property of bonding with positive charges, and the third dispersant and the fourth dispersant, which have a positive charge among the dispersants dispersed in the dispersion, may move in at least one of the barrier rib part and the base part to be bonded to the negative charge of the partition and the base.

Accordingly, it is possible to inhibit a decrease in polarity of the light conversion particles due to a dispersant having a polarity inside the dispersion liquid 330a, and to inhibit movement of the light conversion particles from being hindered.

The optical path control member according to the embodiment may improve the driving speed and driving characteristics of the optical path control member by improving the moving speed of the light conversion particles.

That is, the barrier rib part and/or the base part may include a plurality of negative charges by including the monomer having the bonding group having a high electronegativity in the resin composition forming the barrier rib part and/or the base part, and thus polarity may be increased.

Accordingly, dispersants having positive charges within the light conversion material may be moved toward the barrier rib part and/or the base part, thereby facilitating the movement of the light conversion particles. In addition, the movement speed of the light conversion particles may be improved by inhibiting the negative charge intensity of the light conversion particles from decreasing due to the bonding of the positively charged dispersant with the light conversion particles.

Accordingly, the optical path control member according to the embodiment may have improved driving speed and driving characteristics.

Hereinafter, the present invention will be described in more detail with reference to the forming of the barrier rib part and the base part according to the polarity of the resin composition formation the light conversion unit of the optical path control member according to embodiment examples and comparative examples. These embodiment examples are only presented as examples in order to explain the present invention in more detail. Therefore, the present invention is not limited to these embodiment examples.

Embodiment Example 3

A resin composition was formed by mixing oligomer including a urethane acrylate, a monomer, a photoinitiator, and an antistatic agent.

At this time, the monomer included a first bonding group having an electronegativity of 0.3 to 2 and a second bonding group having an electronegativity of 0 to less than 0.3, and the number of the first bonding group is greater than the number of the second bonding group.

Subsequently, after preparing a mold member including an intaglio portion and an embossed portion, the resin composition is filled in the intaglio portion of the mold member.

Subsequently, after forming a first electrode including indium tin oxide on a first substrate including polyethylene terephthalate, the first electrode and the mold member were bonded.

Subsequently, after the mold member and the resin composition were released, a base part, a barrier rib part with embossed shape, and an accommodating part with intaglio shape were formed on the substrate, and a light conversion material was filled in the accommodating part to form a light conversion unit.

Subsequently, after forming a second electrode including indium tin oxide on a lower portion of a second substrate including polyethylene terephthalate, the optical path control member was formed by adhering the second electrode to the light conversion unit.

Subsequently, after applying a voltage to the optical path control member, the driving speed of the optical path control member was measured.

Comparative Example 3

The optical path control member was formed in the same manner as in Example 3, except that the monomer included more second bonding groups than first bonding groups.

Subsequently, after applying a voltage to the optical path control member, the driving speed of the optical path control member was measured.

TABLE 2

|  | 500 cd/m$^2$ of arrival time (s) |
|---|---|
| Embodiment Example 3 | 2.6 |
| Comparative Example 3 | 10.3 |

Figure 14:
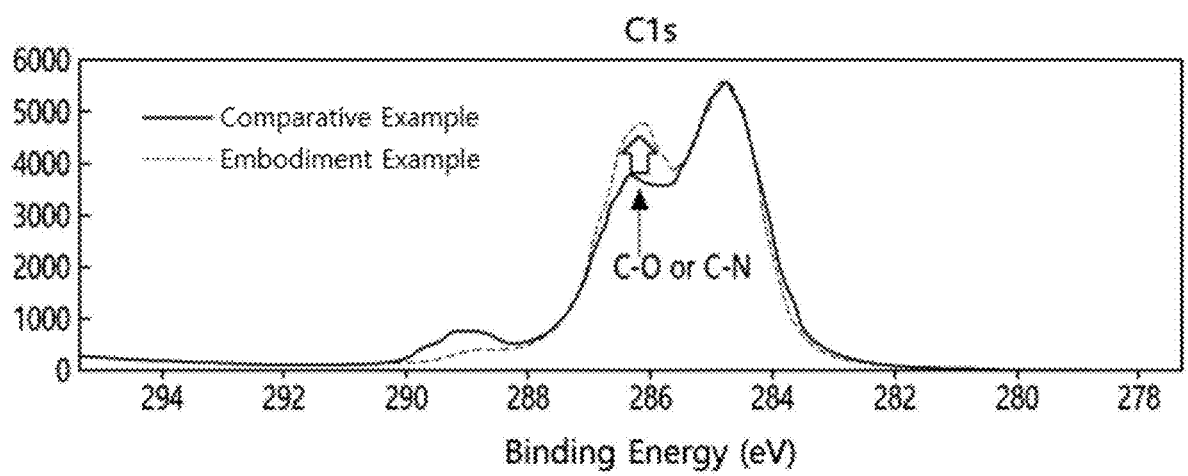
FIG. 14 is a graph of XPS analysis results of the light conversion unit according to the embodiment and the comparative example.

FIG. 14 is a graph showing bond group peaks of resin compositions according to Embodiment Example and Comparative Example measured by X-ray photoelectron spectroscopy.

Referring to FIG. 14, it can be seen that the resin composition according to Embodiment Example includes more bonding groups having higher electronegativity than the resin composition according to Comparative Example.

Figure 15:
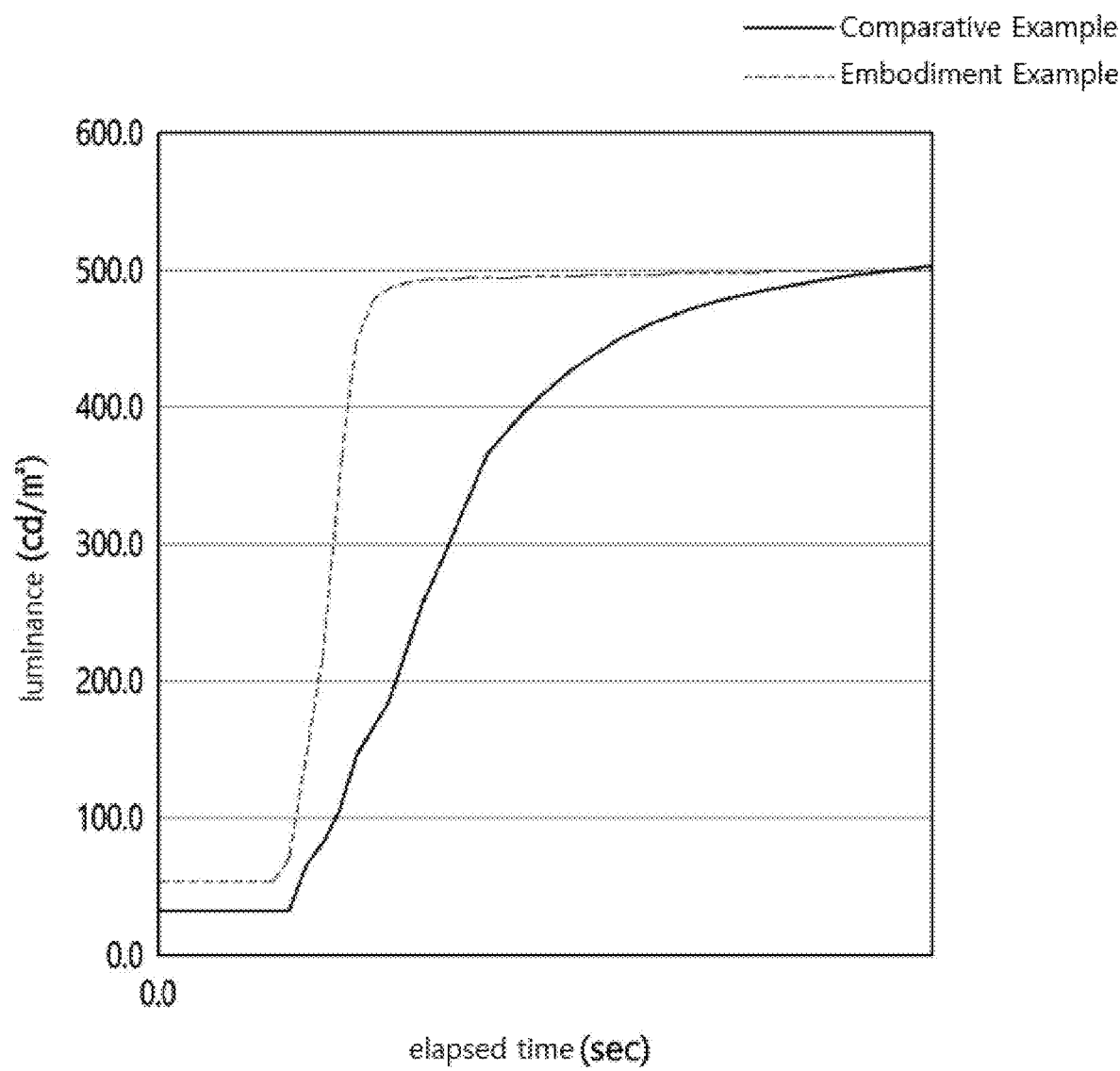
FIG. 15 is a graph for explaining the driving speed of the optical path control member according to the embodiment and the comparative example.

Also, referring to FIG. 15 and Table 2, it can be seen that the driving speed of the optical path control member according to the Embodiment Example is greater than the driving speed of the optical path control member according to the Comparative Example.

That is, in the optical path control member according to the embodiment, a negative charge ratio of the resin composition may be increased by a monomer including the bonding group having high electronegativity. Accordingly, the optical path control member may have improved driving characteristics by inhibiting movement interference and movement speed reduction due to positively charged dispersants among the dispersants.

Hereinafter, referring to FIGS. 16 to 20, a display device to which an optical path control member according to an embodiment is applied will be described.

Figure 16:
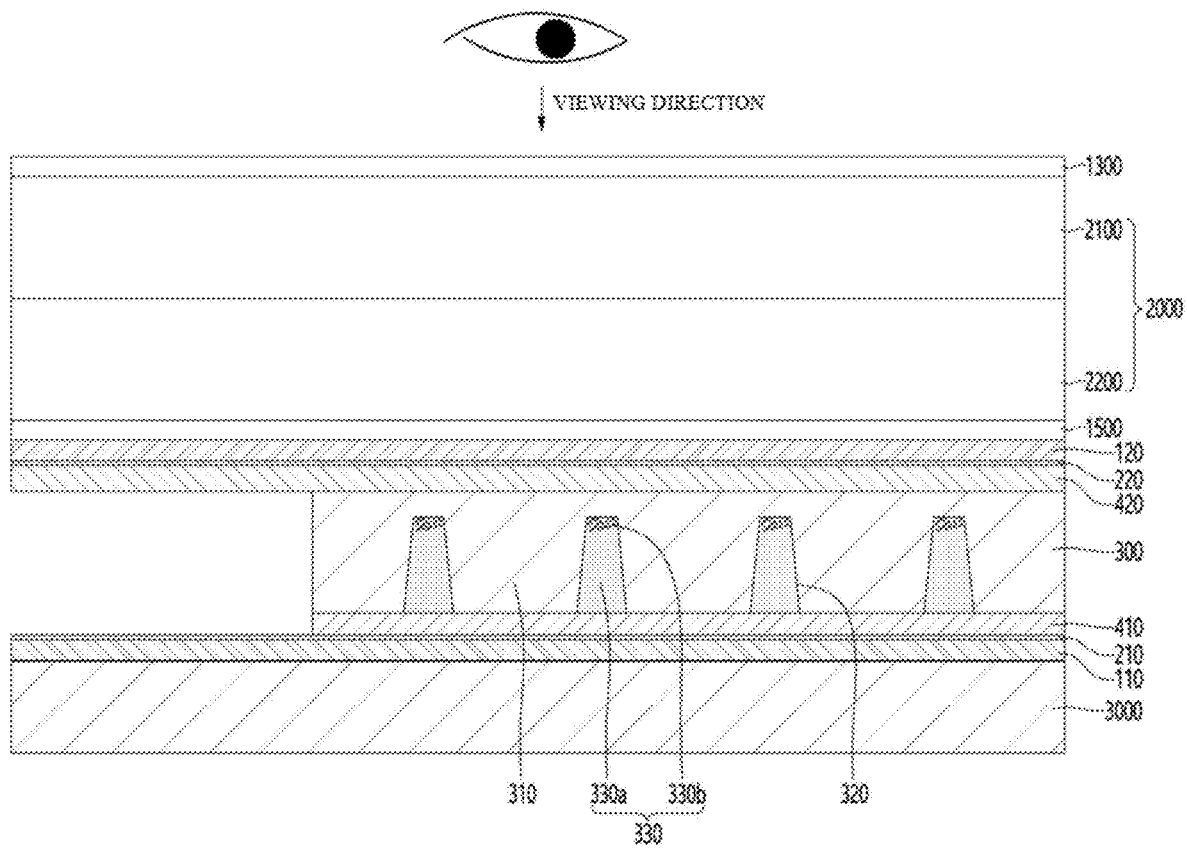
FIGS. 16 and 17 are cross-sectional views of a display device to which an optical path control member according to the embodiment is applied.
Figure 17:
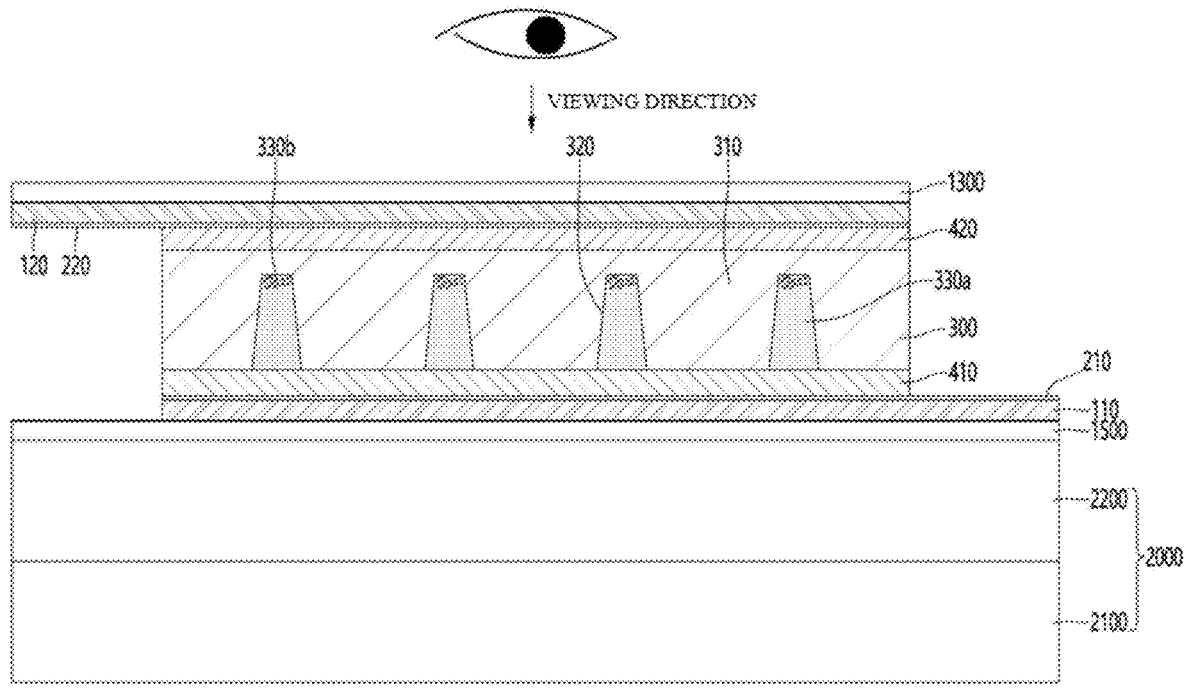

Referring to FIGS. 16 to 17, an optical path control member 1000 according to an embodiment may be disposed on or under a display panel 2000.

The display panel 2000 and the optical path control member 1000 may be disposed to be adhered to each other. For example, the display panel 2000 and the optical path control member 1000 may be adhered to each other via an adhesive layer 1500. The adhesive layer 1500 may be transparent. For example, the adhesive layer 1500 may include an adhesive or an adhesive layer including an optical transparent adhesive material.

The adhesive layer 1500 may include a release film. In detail, when adhering the optical path control member and the display panel, the optical path control member and the display panel may be adhered after the release film is removed.

The display panel 2000 may include a first' substrate 2100 and a second' substrate 2200. When the display panel 2000 is a liquid crystal display panel, the optical path control member may be formed under the liquid crystal panel. That is, when a surface viewed by the user in the liquid crystal panel is defined as an upper portion of the liquid crystal panel, the optical path control member may be disposed under the liquid crystal panel. The display panel 2000 may be formed in a structure in which the first' substrate 2100 including a thin film transistor (TFT) and a pixel electrode and the second' substrate 2200 including color filter layers are bonded to each other with a liquid crystal layer interposed therebetween.

In addition, the display panel 2000 may be a liquid crystal display panel of a color filter on transistor (COT) structure in which a thin film transistor, a color filter, and a black electrolyte are formed at the first' substrate 2100 and the second' substrate 2200 is bonded to the first' substrate 2100 with the liquid crystal layer interposed therebetween. That is, a thin film transistor may be formed on the first' substrate 2100, a protective film may be formed on the thin film transistor, and a color filter layer may be formed on the protective film. In addition, a pixel electrode in contact with the thin film transistor may be formed on the first' substrate 2100. At this point, in order to improve an aperture ratio and simplify a masking process, the black electrolyte may be omitted, and a common electrode may be formed to function as the black electrolyte.

In addition, when the display panel 2000 is the liquid crystal display panel, the display device may further include a backlight unit 3000 providing light from a rear surface of the display panel 2000.

That is, as shown in FIG. 16, the optical path control member may be disposed under the liquid crystal panel and on the backlight unit 3000, and the optical path control member may be disposed between the backlight unit 3000 and the display panel 2000.

Alternatively, as shown in FIG. 17, when the display panel 2000 is an organic light emitting diode panel, the optical path control member may be formed on the organic light emitting diode panel. That is, when the surface viewed by the user in the organic light emitting diode panel is defined as an upper portion of the organic light emitting diode panel, the optical path control member may be disposed on the organic light emitting diode panel. The display panel 2000 may include a self-luminous element that does not require a separate light source. In the display panel 2000, a thin film transistor may be formed on the first' substrate 2100, and an organic light emitting element in contact with the thin film transistor may be formed. The organic light emitting element may include an anode, a cathode, and an organic light emitting layer formed between the anode and the cathode. In addition, the second' substrate 2200 configured to function as an encapsulation substrate for encapsulation may be further included on the organic light emitting element.

In addition, although not shown in drawings, a polarizing plate may be further disposed between the optical path control member 1000 and the display panel 2000. The polarizing plate may be a linear polarizing plate or an external light reflection preventive polarizing plate. For example, when the display panel 2000 is a liquid crystal display panel, the polarizing plate may be the linear polarizing plate. Further, when the display panel 2000 is the organic light emitting diode panel, the polarizing plate may be the external light reflection inhibiting polarizing plate.

In addition, an additional functional layer 1300 such as an anti-reflection layer, an anti-glare, or the like may be further disposed on the optical path control member 1000. Specifically, the functional layer 1300 may be adhered to one surface of the first substrate 110 of the optical path control member. Although not shown in drawings, the functional layer 1300 may be adhered to the first substrate 110 of the optical path control member via an adhesive layer. In addition, a release film for protecting the functional layer may be further disposed on the functional layer 1300.

Further, a touch panel may be further disposed between the display panel and the optical path control member.

It is illustrated in the drawings that the optical path control member is disposed at an upper portion of the display panel, but the embodiment is not limited thereto, and the optical path control member may be disposed at various positions such as a position in which light is adjustable, that is, a lower portion of the display panel, or between a second substrate and a first substrate of the display panel, or the like.

In addition, it is shown in the drawings that the optical conversion unit of the optical path control member according to the embodiment is in a direction parallel or perpendicular to an outer surface of the second substrate, but the optical conversion unit is formed to be inclined at a predetermined angle from the outer surface of the second substrate. Through this, a moire phenomenon occurring between the display panel and the optical path control member may be reduced.

Figure 18:
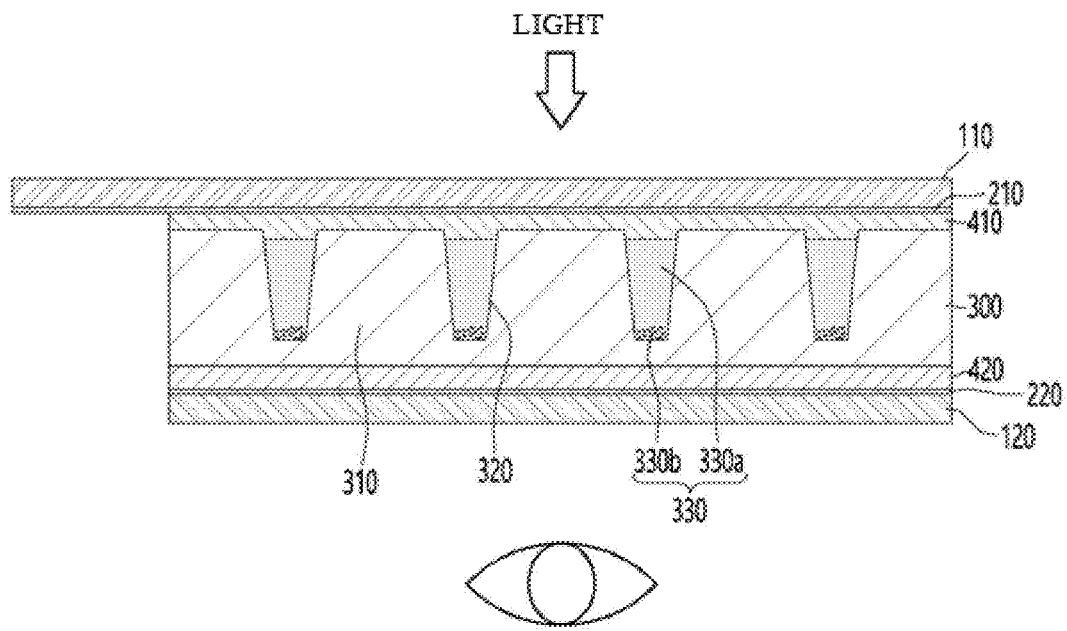
FIGS. 18 to 20 are views for describing one embodiment of the display device to which the optical path control member according to the embodiment is applied.
Figure 18:
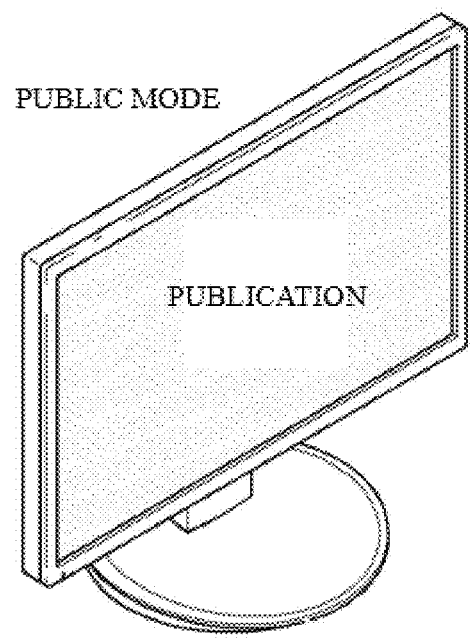
Figure 19:
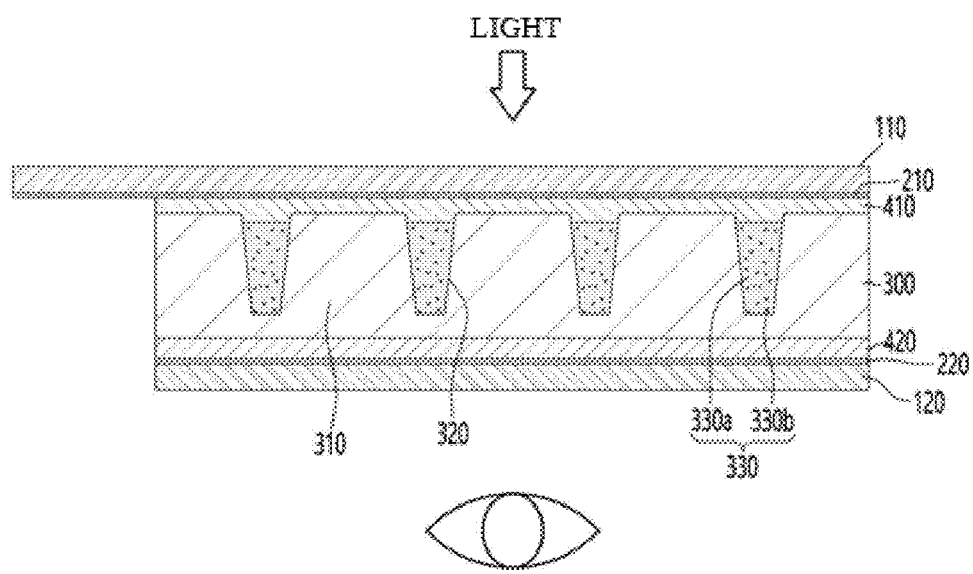
Figure 19:
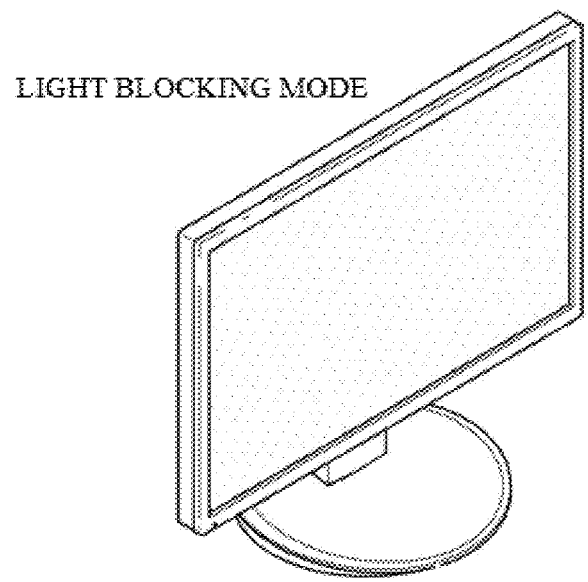
Figure 20:
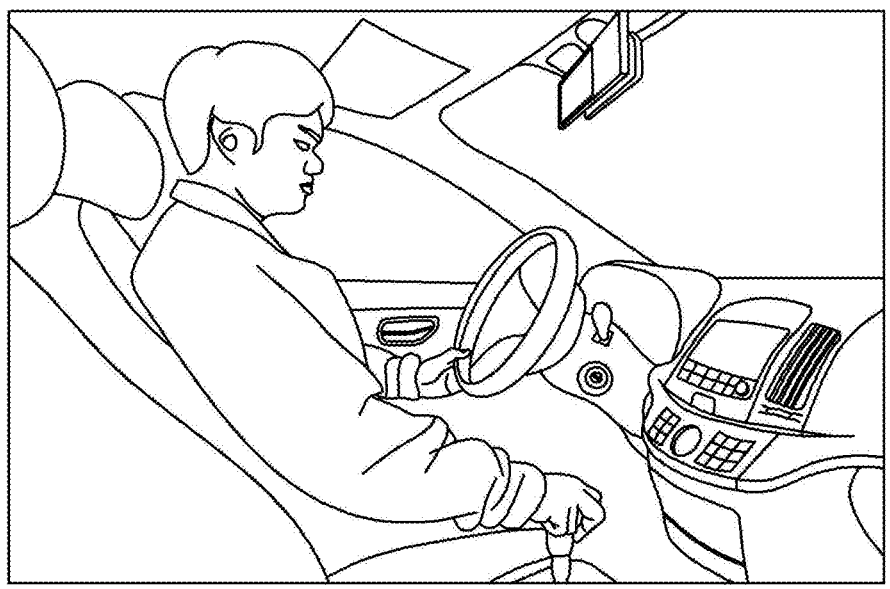

Referring to FIGS. 18 to 20, an optical path control member according to an embodiment may be applied to various display devices.

Referring to FIGS. 18 to 20, the optical path control member according to the embodiment may be applied to a display device that displays a display.

For example, when power is applied to the optical path control member as shown in FIG. 18, the accommodating part functions as the light transmitting part, so that the display device may be driven in the public mode, and when power is not applied to the optical path control member as shown in FIG. 19, the accommodating part functions as the light blocking part, so that the display device may be driven in the light blocking mode.

Accordingly, a user may easily drive the display device in a privacy mode or a normal mode according to application of power.

Light emitted from the backlight unit or the self-luminous element may move from the first substrate toward the second substrate. Alternatively, the light emitted from the backlight unit or the self-luminous element may also move from the second substrate toward the first substrate.

In addition, referring to FIG. 20, the display device to which the optical path control member according to the embodiment is applied may also be applied inside a vehicle.

For example, the display device including the optical path control member according to the embodiment may display a video confirming information of the vehicle and a movement route of the vehicle. The display device may be disposed between a driver seat and a passenger seat of the vehicle.

In addition, the optical path control member according to the embodiment may be applied to a dashboard that displays a speed, an engine, an alarm signal, and the like of the vehicle.

Further, the optical path control member according to the embodiment may be applied to a front glass (FG) of the vehicle or right and left window glasses.

The characteristics, structures, effects, and the like described in the above-described embodiments are included in at least one embodiment of the present invention, but are not limited to only one embodiment. Furthermore, the characteristic, structure, and effect illustrated in each embodiment may be combined or modified for other embodiments by a person skilled in the art. Accordingly, it is to be understood that such combination and modification are included in the scope of the present invention.

In addition, embodiments are mostly described above, but the embodiments are merely examples and do not limit the present invention, and a person skilled in the art may appreciate that several variations and applications not presented above may be made without departing from the essential characteristic of embodiments. For example, each component specifically represented in the embodiments may be varied. In addition, it should be construed that differences related to such a variation and such an application are included in the scope of the present invention defined in the following claims.

The invention claimed is:

1. An optical path control member comprising:
   a first substrate;
   a first electrode disposed on the first substrate;
   a second substrate disposed on the first substrate;
   a second electrode disposed under the second substrate; and
   a light conversion unit disposed between the first electrode and the second electrode,
   wherein the light conversion unit includes a resin composition,
   wherein the resin composition includes an oligomer, a monomer, a photoinitiator, and an additive,
   wherein a molecular weight of the monomer is 600 g/mol or less,
   wherein the light conversion unit includes a plurality of barrier rib parts and an accommodating part between the plurality of barrier rib parts; and a base part between the barrier rib part and the second electrode,
   wherein a thickness deviation of the plurality of barrier rib parts is 5% to 10%, and
   wherein a thickness of the base part is 10 μm or less.

2. The optical path control member of claim 1, wherein a viscosity of the resin composition is 200 cPs to 400 cPs.

3. The optical path control member of claim 1, wherein the monomer includes a first monomer having a molecular weight of 600 g/mol or less; and a second monomer having a molecular weight greater than 600 g/mol,
   wherein a weight % ratio of the first monomer and the second monomer is 1:3 to 2:3.

4. The optical path control member of claim 1, wherein the oligomer is included in 40% to 60% by weight based on the total weight of the resin composition,
wherein the monomer is included in 30% to 40% by weight based on the total weight of the resin composition,
wherein the photoinitiator is included in 0.1% to 5% by weight based on the total weight of the resin composition,
wherein the additive is included in an amount of 0.1% to 5% by weight based on the total weight of the resin composition.

5. The optical path control member of claim 1,
wherein a width deviation of the plurality of barrier rib parts is 3% to 10%.

6. A display device comprising:
a panel including at least one of a display panel and a touch panel; and
the optical path control member of claim 1, which is disposed on or under the panel.

7. The display device of claim 6, wherein the panel includes a backlight unit and a liquid crystal display panel,
wherein the optical path control member is disposed between the backlight unit and the liquid crystal display panel, and
wherein a light emitted from the backlight unit moves in a direction of the second substrate from the first substrate.

8. The display device of claim 6, wherein the panel includes an organic light emitting diode panel,
wherein the optical path control member is disposed on the organic light emitting diode panel, and
wherein a light emitted from the panel moves in a direction of the second substrate from the first substrate.

9. The optical path control member of claim 1, wherein the thickness of the base part is 1 μm to 10 μm.

10. The optical path control member of claim 1, wherein a light conversion material is disposed inside the accommodating part,
wherein the light conversion material includes a dispersion liquid and light conversion particles,
wherein the light conversion particles have a polarity.

11. The optical path control member of claim 10, wherein the monomer includes a first bonding group and a second bonding group,
wherein an electronegativity of a first coupler is 0.3 to 2,
wherein an electronegativity of a second coupler is 0 to 0.3,
wherein the first bonding group is greater than the second bonding group.

12. The optical path control member of claim 11, wherein a contact angle between the resin composition and water is 10° to 60°.

13. The optical path control member of claim 11, wherein the monomer includes at least one bonding group of C—O, C—S, C—N, O—H, N—H, C—Cl, C—Br, C—I, and Si—O—Si.

14. The optical path control member of claim 11, wherein the light conversion material includes a dispersant,
wherein the dispersant includes a polar dispersant and a non-polar dispersant.

15. The optical path control member of claim 14, wherein the light conversion material includes light conversion particles,
wherein the light conversion particles and the polar dispersant have polarities opposite to each other.

16. The optical path control member of claim 14, wherein at least one of the barrier rib part and the base part has a polarity opposite to that of the polar dispersant.

17. The optical path control member of claim 16, wherein at least one of the barrier rib part and the base part includes a negative charge.

* * * * *